United States Patent
Sinha et al.

(10) Patent No.: US 7,292,491 B2
(45) Date of Patent: Nov. 6, 2007

(54) METHOD AND APPARATUS FOR CONTROLLING REFRESH OPERATIONS IN A DYNAMIC MEMORY DEVICE

(75) Inventors: Manoj K. Sinha, Boise, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/295,856

(22) Filed: Dec. 7, 2005

(65) Prior Publication Data

US 2006/0083094 A1  Apr. 20, 2006

Related U.S. Application Data

(63) Continuation of application No. 10/667,775, filed on Sep. 22, 2003, now Pat. No. 7,027,343.

(51) Int. Cl.
*G11C 7/00* (2006.01)

(52) U.S. Cl. ............ 365/222; 365/189.07; 365/189.09; 365/236

(58) Field of Classification Search ........... 365/189.07, 365/189.09, 222, 236
See application file for complete search history.

(56) References Cited

U.S. PATENT DOCUMENTS

| | | | |
|---|---|---|---|
| 4,156,286 A * | 5/1979 | Connors et al. | 365/45 |
| 5,278,796 A * | 1/1994 | Tillinghast et al. | 365/211 |
| 5,532,958 A | 7/1996 | Jiang et al. | 365/222 |
| 6,452,845 B1 | 9/2002 | Merritt | 365/201 |
| 6,452,852 B2 | 9/2002 | Bohm et al. | 365/222 |
| 6,489,831 B1 | 12/2002 | Matranga et al. | 327/512 |
| 6,756,856 B2 * | 6/2004 | Song et al. | 331/176 |

OTHER PUBLICATIONS

A Bakker, et al. "Micropower CMOS Temperature Sensor with Digital Output" *IEEE Journal of Solid-State Circuits*, vol. 31 No. 7, Jul. 1996.
J. Sim, et al. "Binary Weighted Temperature Sensor Adjustment Schemes" pp. 294-297, *Symposium of VLSI Circuits*, 2002.

* cited by examiner

*Primary Examiner*—VanThu Nguyen
(74) *Attorney, Agent, or Firm*—Williams, Morgan & Amerson, P.C.

(57) ABSTRACT

A method and apparatus are provided for controlling refresh operations of a dynamic memory device. The temperature of the dynamic memory device is detected. The detected temperature is then used to adjust a refresh rate of the dynamic memory device to compensate for increased leakage at higher temperatures and more closely tailor the timing of the refresh operations to the conditions of the dynamic memory device.

22 Claims, 9 Drawing Sheets

METHOD AND APPARATUS FOR CONTROLLING REFRESH OPERATIONS IN A DYNAMIC MEMORY DEVICE

CROSS-REFERENCE TO RELATED APPLICATION

This is a continuation of application Ser. No. 10/667,775 filed Sep. 22, 2003, now U.S. Pat. No. 7,027,343.

BACKGROUND OF THE INVENTION

1. Field of the Invention

This invention relates generally to dynamic memory devices, and, more specifically, to controlling refresh operations in a dynamic memory device.

2. Description of the Related Art

Many of today's dynamic memory devices, such as Synchronous RAM (SDRAM), double data rate SDRAM devices (DDR SDRAM), Rambus™ DRAM (RDRAM) and the like, require precise timing schemes for proper operation. For example, data stored in a dynamic memory tends to quickly dissipate and may be lost unless it is periodically refreshed. Thus, the timing of these refresh operations is critical to maintaining the integrity of data stored in a dynamic memory device. The timing of these refresh operations, however, is complicated by the fact that variable external factors, such as temperature, affect the rate at which the charge stored in the memory dissipates.

Accordingly, designers of dynamic memory devices commonly take into consideration the range of temperatures at which the devices are intended to operate. Typically, a charge stored in a dynamic memory device operating at a relatively high temperature dissipates more quickly than a charge stored in a dynamic memory device operating at a relatively low temperature. Thus, if the designer selects the refresh rate to accommodate the worst case mode of operation, i.e., relatively high temperature, then the refresh rate should be sufficiently fast for the entire range of operation. That is, the refresh operation should occur sufficiently often to prevent the loss of data from dissipation.

This worst case design technique suffers from at least one significant deficiency—excessive power consumption. For example, a refresh rate that is determined by the upper boundary of operating temperature range may not provide for an efficient refresh rate for normal use in lower temperature ranges. That is, excessive amounts of power may be consumed by performing refresh operations too often.

Power consumption is a significant factor in electronic devices. It is desirable to reduce power consumption when implementing certain applications. In particular, wireless and battery operated equipment require lower power consumption designs to operate for acceptably long periods of time. Also, there is a drive to design smaller and more efficient electronic circuitry for many devices, such as PDAs, wireless telephones, cellular phones, portable computers, portable sensors and a variety of electronic equipment that are generally sensitive to heat buildup. The wasted power caused by excessive refresh operations typically manifests as additional heat, which may need to be removed to permit proper operation of the device. Additional mechanical cooling devices, however, tend to increase the size and cost of the device.

The present invention is directed to overcoming, or at least reducing, the effects of, one or more of the problems set forth above.

SUMMARY OF THE INVENTION

In one aspect of the present invention, a device is provided. The device is comprised of a sensor and a refresh control rate unit. The sensor is adapted to provide a signal responsive to temperature. The refresh rate control unit is operatively coupled with the sensor, and is adapted to adjust a refresh rate associated with at least a portion of the device in response to the temperature signal.

In another aspect of the present invention, a method is provided. The method comprises detecting a temperature of at least a portion of a memory device, and adjusting a refresh rate associated with at least a portion of the memory device in response to the magnitude of the detected temperature.

In another aspect of the present invention, a computer system is provided. The computer system is comprised of a processor, a memory and a memory controller. The memory controller operatively couples the processor with the memory and is adapted to control refresh operations of the memory. The memory controller is comprised of a sensor and a refresh rate control unit. The sensor is adapted to provide a signal responsive to a temperature of at least a portion of the memory. The refresh rate control unit is operatively coupled with the sensor. The refresh rate control unit is adapted to adjust a refresh rate associated with at least a portion of the memory in response to the temperature signal.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
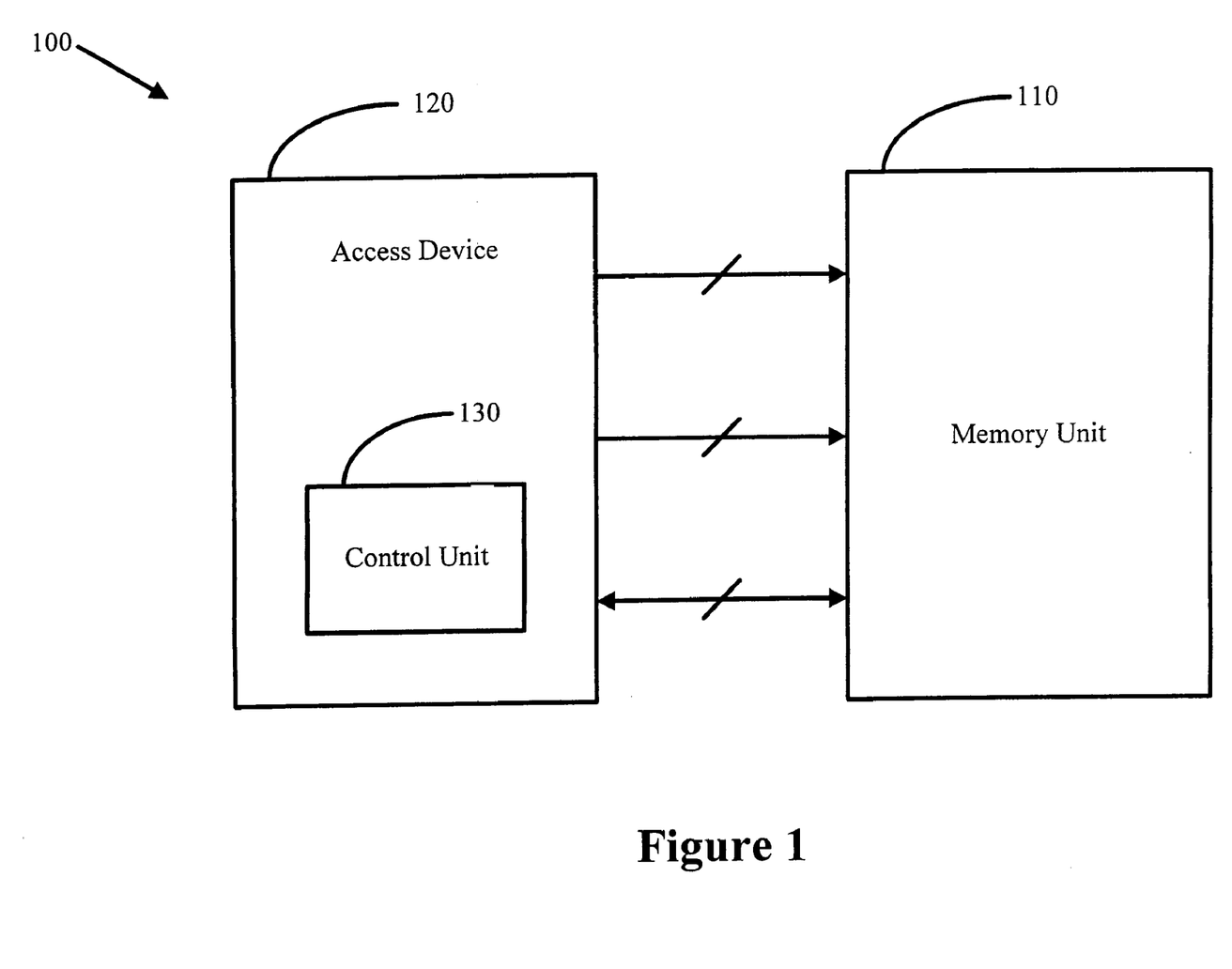
FIG. 1 illustrates a block diagram of a system including a device that is capable of accessing and/or testing a memory, in accordance with one illustrative embodiment of the present invention.

Referring to FIG. 1, a block diagram of a system 100 is illustrated, in accordance with one embodiment of the present invention. The system 100 comprises a memory unit 110 capable of storing and retrieving data, which may be accessed by a device 120. The access device 120 comprises a control unit 130 capable of accessing data stored in the memory unit 110. The access device 120 may be any device that uses the memory unit 110 to store data, read data, or both. Examples of the access device 120 may include, but are not limited to, a computer unit such as desktop or portable computer, a camera, a telephone, a cellular phone, a television, a radio, a calculator, a personal digital assistant (PDA), a network switch, a setup-box, and the like.

The control unit 130, in one embodiment, may manage operations of the access device 120 with respect to writing and reading data to and from the memory unit 110. The control unit 130 may comprise a microprocessor, a microcontroller, a digital signal processor, a processor card (including one or more microprocessors or controllers), a memory controller, or other control or computing devices.

The memory unit 110 in the illustrated embodiment may be a volatile memory, such as DRAM, DDR SDRAM, Rambus™ DRAM (RDRAM) and the like. In one embodiment, the access device 120, via the control unit 130, provides appropriate power and control signals to access memory locations in the memory unit 110. The memory unit 110 may be external to, or internal (e.g., integrated) to, the access device 120. The access device 120, such as a computer system, may employ a memory unit 110 that is integrated within the computer system to store data (e.g., application programs, data, and the like) related to the computer system.

Figure 2:
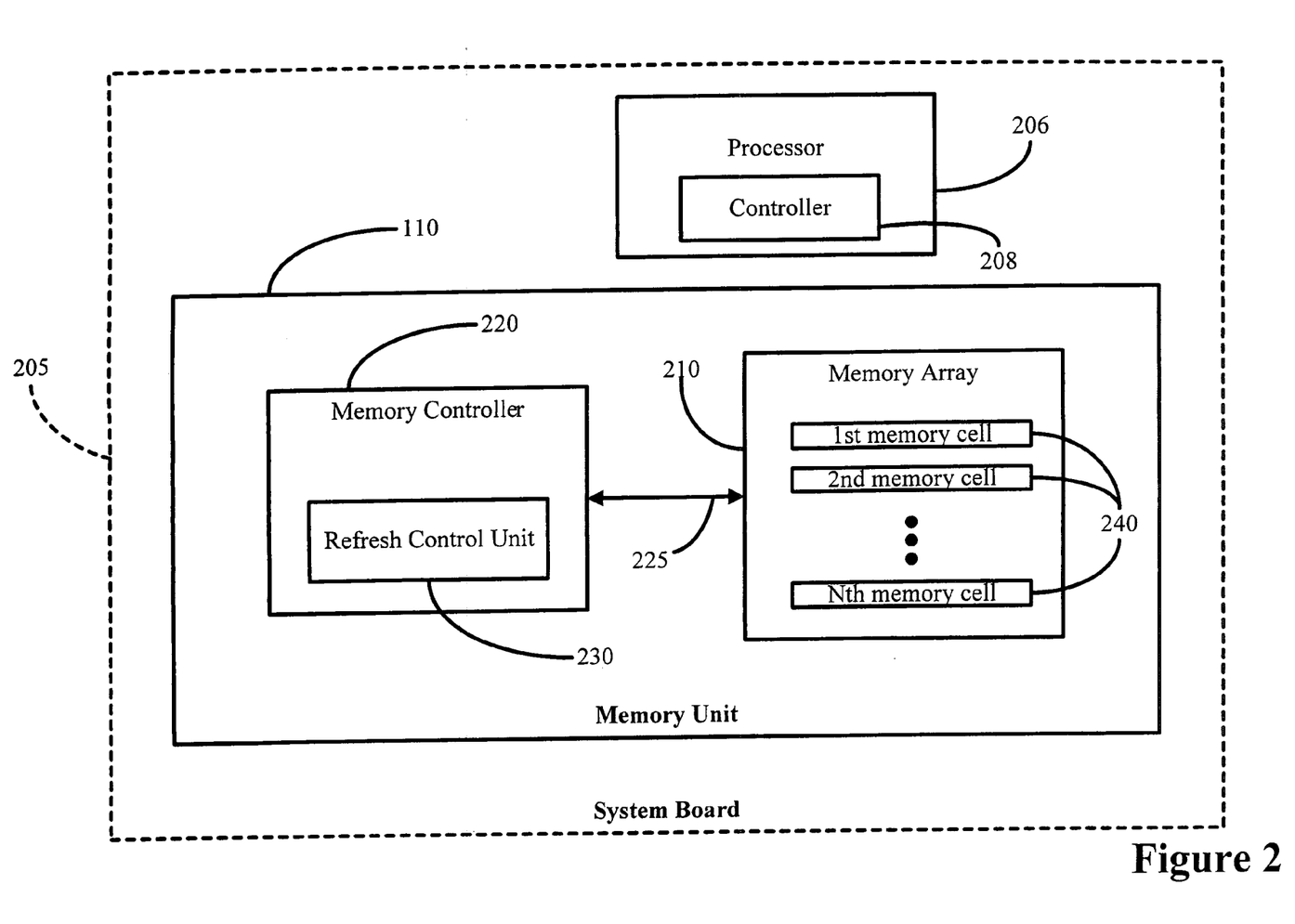
FIG. 2 illustrates a block diagram of the memory unit of FIG. 1, in accordance with one illustrative embodiment of the present invention.

Turning now to FIG. 2, the memory unit 110 may be part of a system board 205 that includes a processor 206. The system board 205 may be a motherboard that is utilized in a variety of types of computer systems, such as an IBM® compatible computer system, a workstation computer system, a mainframe computer system, an Apple® computer system, a portable computer, a PDA, and the like.

A block diagram representation of at least a portion of the memory unit 110 of FIG. 1 relative to the system board 205 is illustrated in FIG. 2. The memory unit 110 may comprise a memory array 210 and a memory controller 220. Those skilled in the art will appreciate that the memory controller 220 and the memory array 210 may be located in close proximity to one another on a common substrate, such as a printed circuit board or semiconductor substrate. Alternatively, the memory controller 220 and the memory array 210 may be located on separate semiconductor substrates or separate printed circuit boards, separated by a relatively significant distance.

The memory array 210 may comprise a plurality of memory cells 240 ($1^{st}$ through $N^{th}$ memory cells 240) that are capable of storing data. The memory controller 220 is capable of receiving and executing memory access functions in response to instructions from the processor 206, which contains its own controller 208 to access data stored in the memory device 110. In one embodiment, the memory array 210 may be electrically coupled to the memory controller 220 via a plurality of lines 225, which may include address lines, data lines, and control lines. Access to the memory array 210 may be directed to one or more of the memory cells 240 in response to address signals received over the address and control lines 225. Once accessed, data may be written to or read from the memory array 210 over the data lines 225. In one embodiment, the memory controller 220 may comprise a refresh control unit 230 to control refresh cycles performed by the memory unit 110. In the illustrated embodiment, the refresh control unit 230 is capable of reactively adjusting the refresh cycle in response to a given range of temperatures. A more detailed description of the refresh control unit 230 is provided below.

Figure 3:
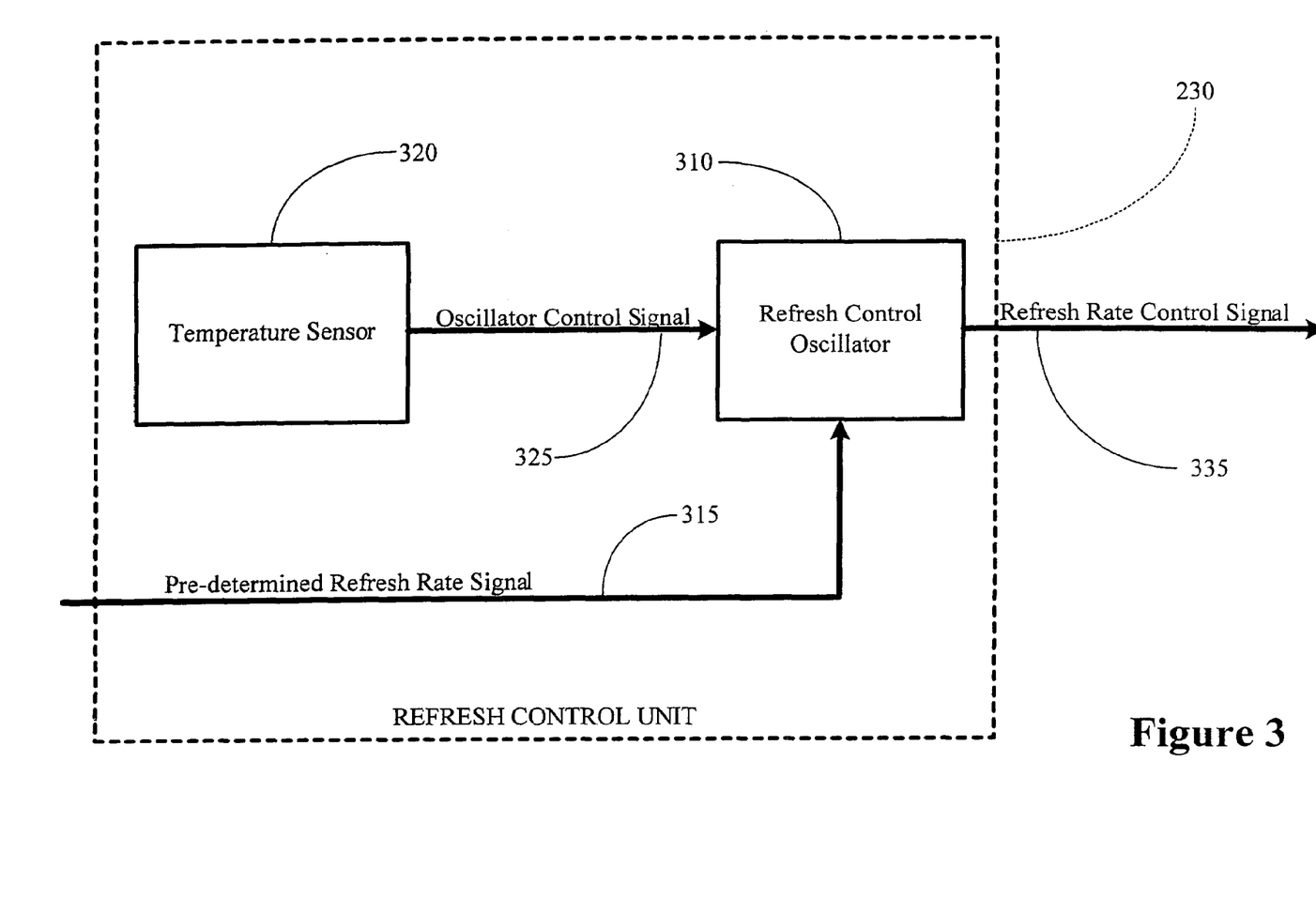
FIG. 3 illustrates a block diagram depiction of a refresh control unit of FIG. 2, in accordance with one illustrative embodiment of the present invention.

Turning now to FIG. 3, a more detailed block diagram illustration of one embodiment of the refresh control unit 230 is provided. The refresh control unit 230 may comprise a temperature sensor 320 that influences the refresh operation of a refresh control oscillator 310. The temperature sensor 320 is capable of generating an oscillator control signal on a line 325. The oscillator control signal on the line 325 may be used to control the frequency of the refresh cycles that may be implemented in the memory device 110. Generally, the higher the frequency of the refresh cycle, the more power that the memory device 110 consumes. Therefore, instead of implementing a worst-case refresh cycle that ensures proper operation of the memory device 110 at extreme temperatures, a reactive adjustment of the frequency of the refresh cycle may be implemented. Therefore, during normal temperature ranges, a more efficient refresh cycle may be implemented, and during extreme conditions, such as high temperature ranges, appropriate refresh cycles may be implemented, thereby promoting many advantages, such as power savings.

Those skilled in the art will appreciate that while the temperature sensor 320 is illustrated as part of the refresh control unit 230, its physical location may vary according to the design of the memory unit 110. For example, the temperature sensor 320 is intended to provide a signal representative of the temperature of at least a portion of the memory array 210, and thus, it may be advantageously positioned in proximity to the memory array 210. Therefore, it may prove useful to locate at least a portion of the temperature sensor within or adjacent the memory array 210. Those skilled in the art, however, will appreciate that a more remote location of the temperature sensor 320 may be effected while still providing an adequate indication of temperature of the memory array in some applications.

The oscillator control signal on the line 325 may be used to control or vary the oscillator operation of the refresh control oscillator 310. Generally, the refresh control oscillator 310 may receive a signal indicative of a predetermined refresh rate on a line 315, which is used to generate a refresh rate control signal on a line 335. The refresh rate control signal on the line 335 may be used by the memory controller 220 to control the refresh operation in order to maintain the integrity of data stored in the memory array 210. Based upon detected changes in the temperature, the temperature sensor 320 may modify the operation of the refresh control oscillator 310 by providing an updated oscillator control signal on the line 325. For example, if the temperature is low, such that a less frequent refresh is adequate to maintain the integrity of data stored in the memory array 210, the temperature sensor 320 provides an oscillator control signal on the line 325 that prompts the refresh control oscillator 310 to reduce its rate of oscillation. Therefore, via the refresh rate control signal on the line 335, the rate of refresh is reduced. The refresh control unit 230 is thus capable of adaptively adjusting the refresh rate by which the memory controller 220 refreshes the memory array 210.

Figure 4:
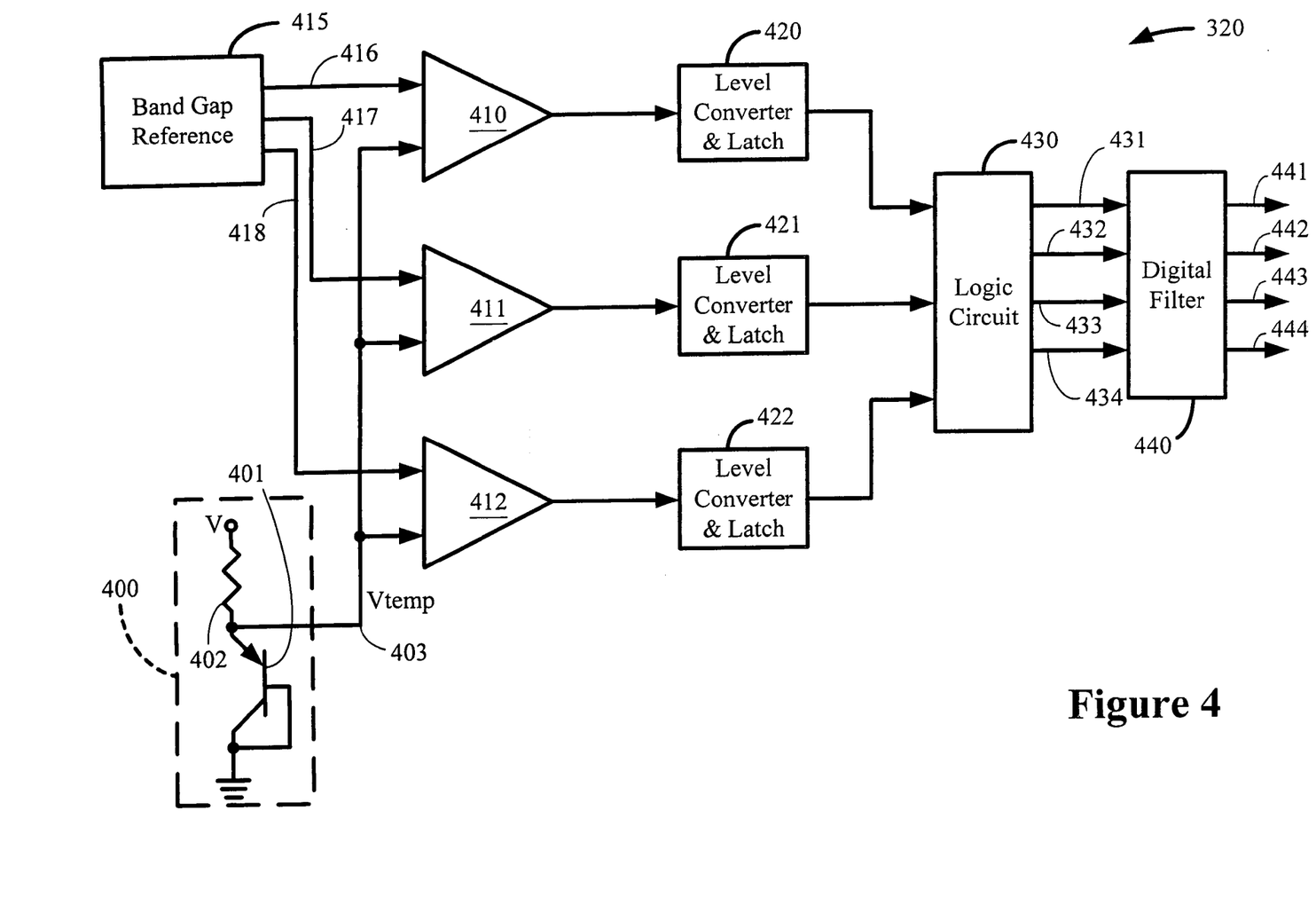
FIG. 4 illustrates a block diagram depiction of a first embodiment of a temperature sensor of FIG. 3.

Turning now to FIG. 4, a more detailed block diagram depiction of one embodiment of the temperature sensor 320 is illustrated. A temperature sensitive device 400 is capable of providing an electrical signal responsive to the environmental temperature to which it is exposed. In the illustrated embodiment, the device 400 is placed in thermal communication with the memory array 210 (see FIG. 2). Thus, the device 400 is exposed to an environmental temperature that is related to the temperature of at least a portion of the memory array 210. Accordingly, variations in the temperature to which the memory array 210 is exposed cause corresponding variations in an electrical signal produced by the device 400. In the illustrated embodiment, temperature dependent characteristics of a base to emitter voltage ($V_{be}$) of a PNP type transistor 401 are advantageously employed to produce the temperature dependent signal $V_{temp}$. In one embodiment, the PNP type transistor 401 may be formed in a common substrate with the memory array 210.

In one embodiment, the temperature sensitive device 400 is comprised of the PNP type transistor 401 configured as a diode and coupled in series with a resistor 402 between a voltage supply $V_{cc}$ and ground. Thus, the voltage appearing at the junction of the resistor 402 and the PNP type transistor 401 is approximately $V_{be}$. As the temperature to which the device 400 is exposed changes, so to will the voltage $V_{be}$, and correspondingly, the voltage applied to a line 403. In one embodiment, the temperature dependence of the voltage $V_{be}$ is approximately –2 mV/° K. Thus, as the temperature of the device 400 rises, the voltage applied to the line 403 falls at a rate of about 2 mV for each 1° K rise in temperature.

The line 403 is coupled to a first input terminal of a set of three comparators 410, 411, 412. The second input terminals of the comparators 410, 411, 412 are coupled to a source of temperature independent voltage, such as a band gap reference 415. Generally, the band gap reference 415 provides a reference voltage that is relatively independent of temperature variation. In the illustrated embodiment, three reference voltage levels V1, V2, V3 are generated using a conventional resistor-based divider circuit. These three reference voltage levels will also be relatively independent of temperature variations. That is, while the voltage $V_{temp}$ of the signal produced by the temperature sensitive device 400 varies with temperature, the voltage signals V1, V2, V3 substantially do not. These three reference voltages V1, V2, V3 are communicated to the second input terminals of the comparators 410, 411, 412 over lines 416, 417, 418, respectively.

Those skilled in the art will appreciate that while three comparators 410, 411, 412 are shown in the instant embodiment, the number may be varied according to various design considerations. For example, where a finer degree of control over the refresh period of the memory array 210 is desired, more comparators may be employed. On the other hand, where a coarser degree of control over the refresh period of the memory array 210 is desired or tolerable, fewer comparators may be employed. In either case, the number of comparators may be varied without departing from the spirit and scope of the instant invention.

The comparators 410, 411, 412 are arranged to assert a signal in response to the temperature dependent voltage $V_{temp}$ on the line 403 exceeding the reference voltage V1, V2, V3 to which the comparators 410, 411, 412 are coupled. For example, when the temperature dependent voltage $V_{temp}$ on the line 403 is more than all three of the reference voltages V1, V2, V3, all of the comparators 410, 411, 412 will assert a signal at their output terminals. Thus, the three asserted signals indicate that the temperature of the memory array 210 is less than the first setpoint temperature T1. As the temperature rises above T1, the temperature dependent voltage $V_{temp}$ on the line 403 falls below the first reference voltage V1 coupled to the comparator 410, but remains below the second and third reference voltage levels V2, V3 coupled to the comparators 411, 412. Thus, the output terminal of the comparator 410 is unasserted, whereas the output terminals of the comparators 411, 412 remain asserted, indicating that the temperature of the memory array 210 is greater than T1. As the temperature of the memory array 210 rises above a second setpoint temperature T2, the temperature dependent voltage $V_{temp}$ on the line 403 will be less than the second reference voltage V2 coupled to the comparator 411, but remains above the third reference voltage V3 coupled to the comparator 412. Thus, the output terminal of the comparators 410, 411 are unasserted, whereas the output terminal of the comparator 412 remains asserted, indicating that the temperature of the memory array 210 is greater than T2. Finally, as the temperature of the memory array 210 rises above a third setpoint temperature T3, the temperature dependent voltage $V_{temp}$ on the line 403 will be lower than the third reference voltage V3 coupled to the comparator 412. Thus, the output terminals of the comparators 410, 411, 412 are all unasserted, indicating that the temperature of the memory array 210 is greater than T3.

Those skilled in the art will appreciate that the output signals from the comparators 410, 411, 412 may be used to identify four distinct temperature ranges, as shown in Table I below:

TABLE I

| Comparator 412 | Comparator 411 | Comparator 410 | Temperature Range (t) |
| --- | --- | --- | --- |
| 1 | 1 | 1 | t < T1 |
| 1 | 1 | 0 | T1 < t < T2 |
| 1 | 0 | 0 | T2 < t < T3 |
| 0 | 0 | 0 | t > T3 |

Figure 6A:
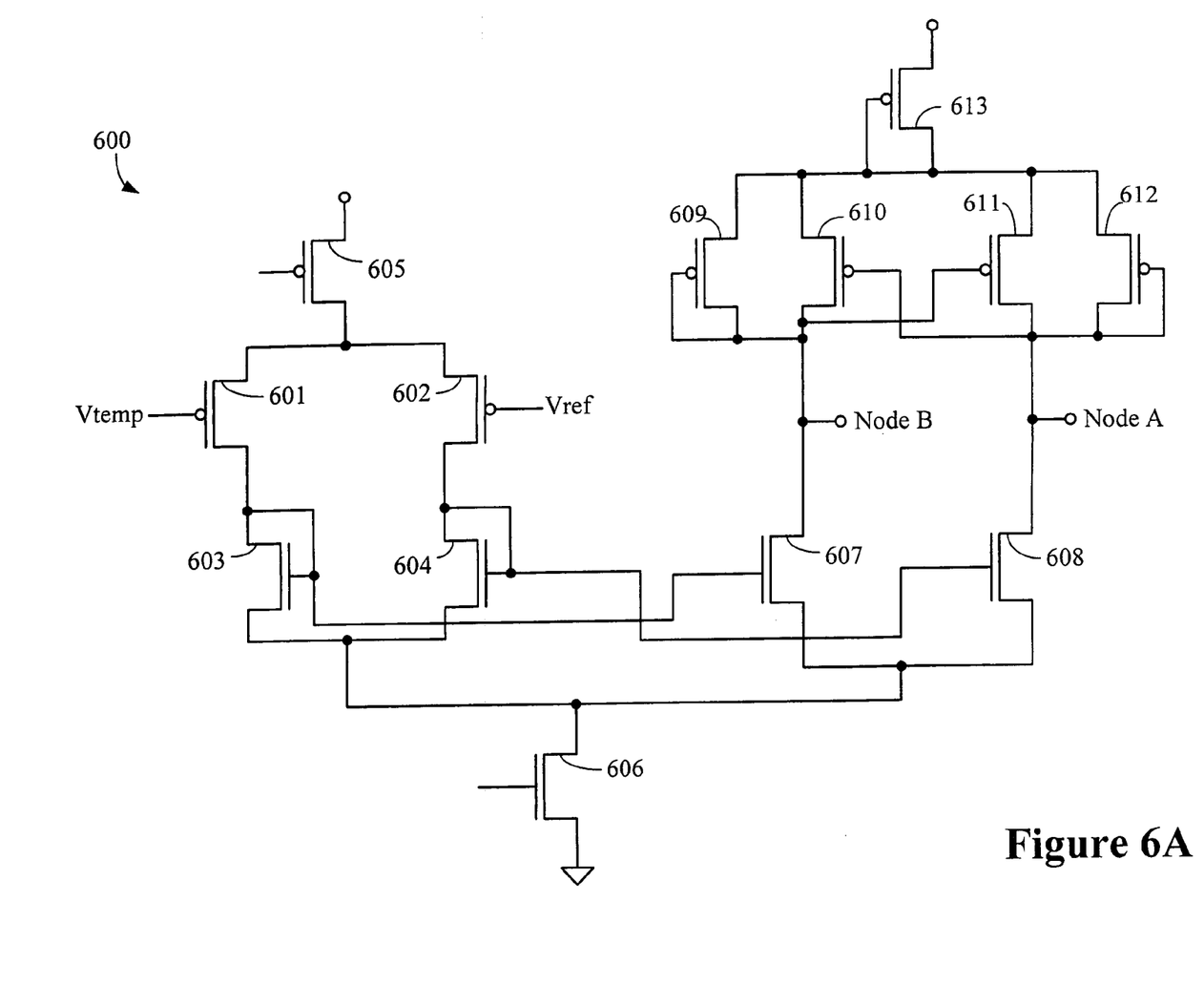
FIGS. 6A and 6B illustrate schematic diagrams of one embodiment of selected portions of the temperature sensor of FIG. 4.

In some embodiments of the instant invention, it may be useful to employ hysteresis in setting the switching points of the comparators 410, 411, 412. That is, it may be useful to allow the comparators 410, 411, 412 to be asserted in response to the temperature dependent signal exceeding the corresponding setpoint, but requiring that the temperature dependent signal fall substantially below the corresponding setpoint before allowing the comparators 410, 411, 412 to switch back to an unasserted state. The use of hysteresis may reduce the possibility of one or more of the comparators 410, 411, 412 oscillating repeatedly between asserted and unasserted states. Exemplary circuitry that may be employed to introduce hysteresis into the operation of the comparators 410, 411, 412 is shown in and discussed below in conjunction with the embodiments of FIG. 6.

Level converter and latches 420, 421, 422 are coupled to the output terminals of the comparators 410, 411, 412, respectively. Generally, the function of the level converter and latches 420, 421, 422 is to convert the asserted and unasserted signals provided by the comparators 410, 411, 412 to voltage levels compatible with and corresponding to CMOS circuitry, and to store the CMOS type signals for subsequent processing.

A logic circuit 430 is coupled to output terminals of the level converter and latches 420, 421, 422. The logic circuit 430 has four output lines 431, 432, 433, 434, each representing one of the four temperature ranges identified above in Table I. That is, when the comparators 410, 411, 412 detect that the temperature range is in the first range (t<T1), then a signal is asserted on output line 431. Similarly, when the comparators 410, 411, 412 detect that the temperature range is in the second range (T1<t<T2), then a signal is asserted on output line 432. When the comparators 410, 411, 412 detect that the temperature range is in the third range (T2<t<T3), then a signal is asserted on output line 433. Finally, when the comparators 410, 411, 412 detect that the temperature range is in the fourth range (T3<t), then a signal is asserted on output line 434.

A digital filter 440 has four input terminals coupled to the four output terminals 431, 432, 433, 434 of the logic circuit 430. The digital filter 440 also has four corresponding output terminals 441, 442, 443, 444. The function of the digital filter 440 is to reduce the likelihood of providing a spurious false signal indicating that the temperature has moved into one of the four ranges when it has not. The digital filter may assert a signal on one of its output terminals 441, 442, 443, 444 if it receives an asserted signal on one of its corresponding input terminals for a preselected number of sample periods. For example, in one embodiment of the instant invention, the digital filter 440 receives an asserted signal on its input terminal for two consecutive sample periods before it asserts a signal on the corresponding output terminal 441, 442, 443, 444. In this way, the digital filter 440 ensures that momentary shifts into another temperature zone or short-lived spurious signals are not communicated to the refresh control oscillator 310.

A variety of hardware and software implementations of the refresh control oscillator 310 are envisioned. For example, the refresh control oscillator 310 may take the form of a counter coupled to an oscillator. The refresh period may then be varied by selecting a different bit of the counter as the refresh signal, depending on the temperature range detected by the temperature sensor 320. Alternatively, the refresh period may also be adjusted by using the signals produced by the temperature sensor 320 to vary the oscillator frequency.

Figure 5:
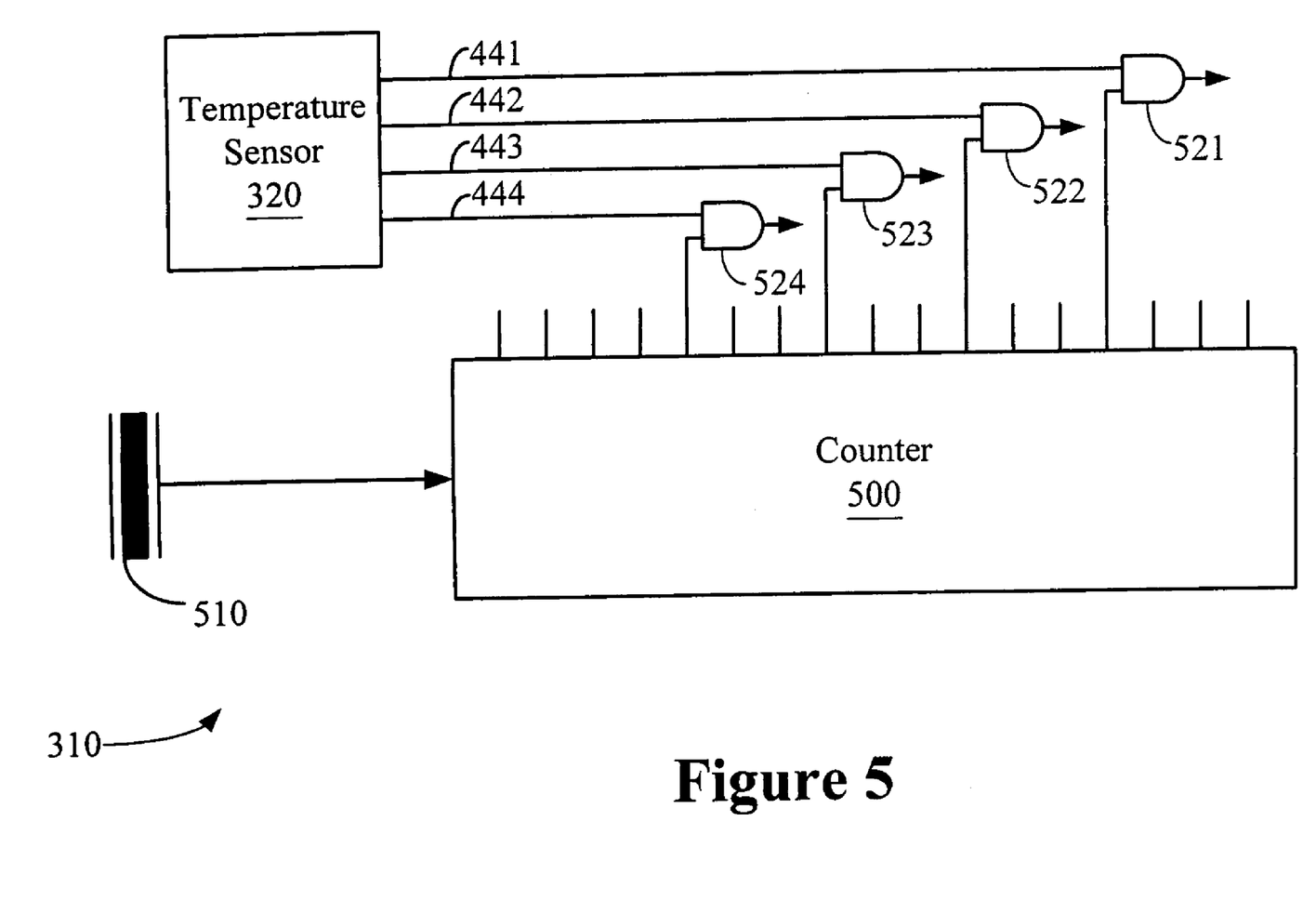
FIG. 5 illustrates a block diagram depiction of one embodiment of a refresh control oscillator of FIG. 2.

An exemplary embodiment of the refresh control oscillator 310 is shown in FIG. 5. A counter 500 has its clock input coupled to an oscillator 510, such as a crystal oscillator. Selected output terminals of the counter 500 are coupled to logical gates, such as AND gates 521, 522, 523, 524. The logical gates 521, 522, 523, 524 each have a second input terminal respectively coupled to the output terminals 441, 442, 443, 444 of the temperature sensor 320. Thus, the temperature sensor 320 enables a selected one of the AND gates 521, 522, 523, 524 to pass its corresponding bit of the counter 500 as the refresh signal. In this way, the temperature sensor 320 is enabled to select one of four refresh rates.

Turning now to FIG. 6A a transistor level schematic for an exemplary embodiment of a comparator 600 that may be used for any of the comparators 410, 411, 412 of FIG. 4 is shown. A first portion of the circuit is a preamplification circuit, which may take the form of a differential amplifier with active loads 603, 604. The signals $V_{temp}$ and $V_{ref}$ are electrically coupled to the bases of a pair of PMOS type transistor 601, 602, respectively. The transistors 601, 602 are in turn respectively serially coupled to a pair of NMOS type transistors 603, 604, which are configured as diodes. Both sets of serially connected transistors 601, 603; 602, 604 are coupled between a voltage supply V and ground through control transistors 605, 606. The transistor 605 is used to provide a bias current. The transistor 606 is used to selectively enable operation of the comparator 600 at desired time intervals.

The second part of the circuit, which comprises transistors 607-613, constitute a decision making portion of the circuit. The current flowing through transistors 603, 604 is mirrored into the transistors 607, 608 depending upon the relative voltage levels of the signals $V_{temp}$ and $V_{ref}$. The transistors 607, 608 are each coupled in series with a pair of parallel arranged transistors 609, 610; 611, 612. The transistors 607-612 are coupled between a voltage source V and ground by the control transistor 606 and a transistor 614 configured as a diode. This circuit uses a cross coupled connection between transistors 610, 611 to increase the gain of the circuit.

Operation of the comparator 600 may be appreciated by a discussion of specific examples, such as when the signal $V_{temp}$ rises above the signal $V_{ref}$. The signals $V_{temp}$ and $V_{ref}$ bias the PMOS transistors 601 and 602, causing them to conduct a differential current flowing through active loads 603, 604. This current is mirrored to NMOS transistors 607, 608. Since $V_{temp} > V_{ref}$, the NMOS transistor 608 will be biased "on" more strongly than the NMOS transistor 607. The higher current flowing through the transistor 608 will pull down the node A more quickly. Once node A falls sufficiently low, the transistor 610 begins to conduct to pull node B to a logically high level. The logically high level at node B will bias the transistor 611 "off," further urging node A toward ground.

Alternatively, when the signal $V_{temp}$ falls below the signal $V_{ref}$, the transistor 607 will be biased "on" more strongly and will pull output node B down more quickly. Once Node B falls sufficiently low, the transistor 611 will begin to conduct, along with the transistor 612, to pull node A to a logically high level. The logically high level at Node A will bias the transistor 610 "off," further urging Node B toward ground.

Those skilled in the art will appreciate that hysteresis may be introduced into the operation of the comparator 600 by mismatching the sizes of the transistors 609, 610 and 611, 612. In one exemplary embodiment, the transistors 609, 612 have a size of approximately 205 microns, whereas the transistors 610, 611 are about 200 microns. This variation in size means that the comparator 600 will switch at slightly different points, depending upon whether the signal $V_{temp}$ is falling below or rising above the signal $V_{ref}$. In one exemplary embodiment, a 5 mV difference has been observed in switching points.

Figure 6B:
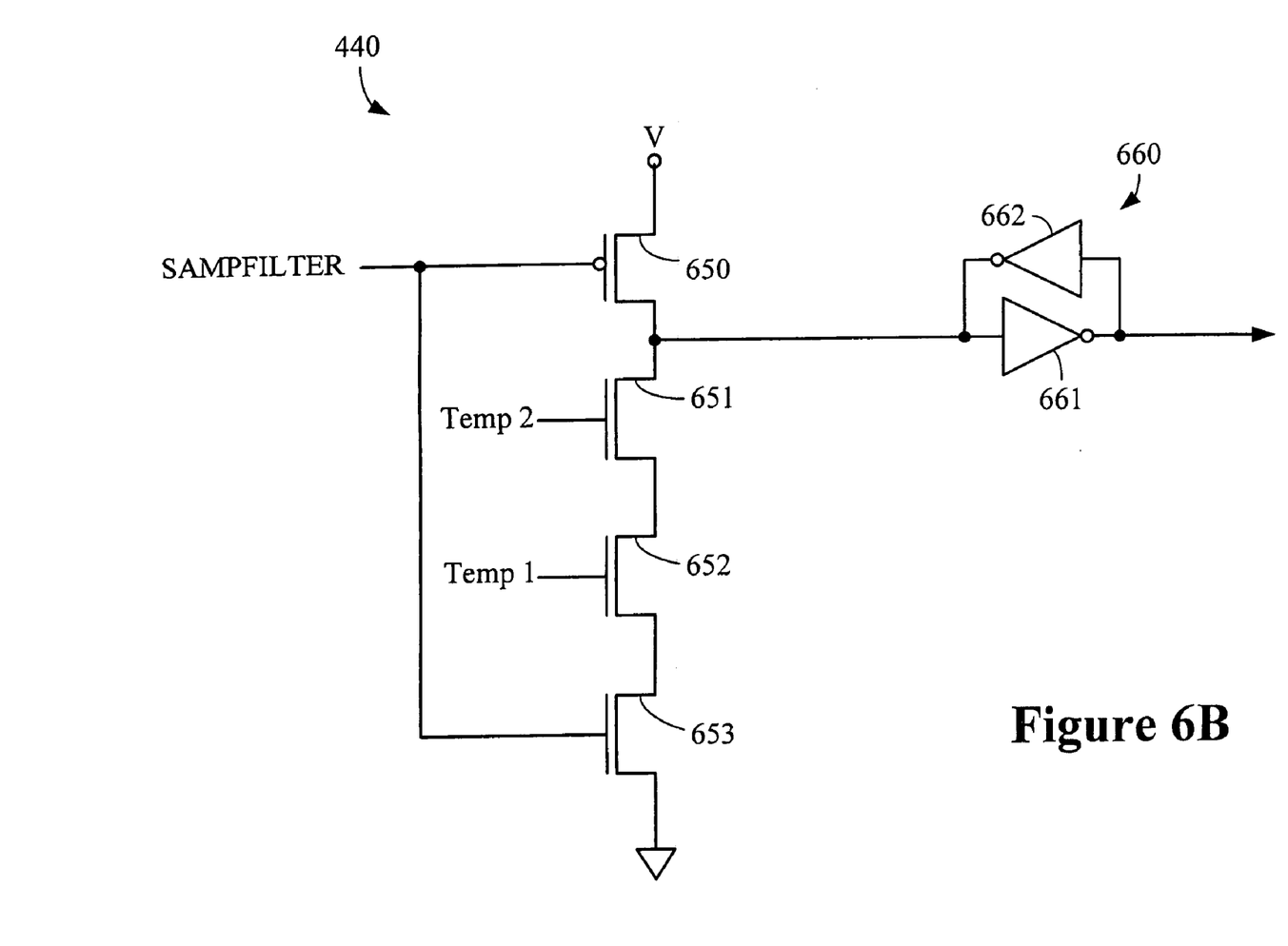

Turning now to FIG. 6B, a transistor level schematic for an exemplary embodiment of a selected portion of the digital filter 440 of FIG. 4 is shown. The portion of the digital filter 440 illustrated in FIG. 4B may be replicated four times with each replicated portion being coupled to one of the lines 431, 432, 433, 434 from the digital circuit 430 of FIG. 4. The digital filter 440 includes four transistors 650, 651, 652, 653 serially connected between a voltage supply V and ground. The transistors 650, 653 are respectively a PMOS and an NMOS type transistor, and both have their bases coupled to receive a control signal, SAMPFILTER. The transistors 651, 652 are both NMOS type transistors with their bases respectively coupled to receive the last two temperature signals, TEMP1 and TEMP2 generated on the corresponding line 431, 432, 433, 434 from the logic circuit 430. The TEMP1 and TEMP2 signals may be derived from a pair of serially connected flip flops or latches (not shown) that are clocked at a frequency approximately twice the frequency associated with the SAMPFILTER signal. Thus, each time the SAMP-FILTER signal transitions, the flip flops will have received and stored the last two temperature signals over, for example the line 431.

A latch 660 is coupled to a junction of the transistors 650, 651, and has an output terminal that is coupled to one of the output lines 441, 442, 443, 444. In the illustrated embodiment, the latch 660 is comprised of a pair of invertors 661, 662 coupled in a complementary arrangement.

Operation of the digital filter 440 begins with the signal SAMPFILTER transitioning to a logically low level, which biases the transistor 650 "on," and the transistor 653 "off." With the transistor 650 biased "on," the input terminal of the latch 660 is pulled to a logically high level, causing the output of the latch 660 to be at a logically low level. Thereafter, the signal SAMPFILTER transitions to a logically high level, which biases the transistor 650 "off," and the transistor 653 "on." If the last two temperature signals, TEMP1 and TEMP2, are logically high, indicating that the sensed temperature has exceeded the corresponding threshold, then all three of the transistors 651, 652, 653 will be biased "on," pulling the input terminal of the latch 660 to a logically low level. The latch 660 then delivers a logically high signal, indicating sensed temperature has exceeded the corresponding threshold. On the other hand, if either of the last two temperature signals, TEMP1 and TEMP2, have not exceeded the threshold, then at least one of the transistors 651, 652 will be biased "off," preventing the input terminal of the latch from being pulled to a logically low level.

Thus, those skilled in the art will appreciate that the illustrated circuitry requires two consecutive temperature signals, TEMP1 and TEMP2, to be logically "high" before the digital filter 440 will produce a corresponding output signal. Additionally, those skilled in the art that the number of consecutive signals may be varied by correspondingly varying the number of transistors 451, 452 and their corresponding flip flops (not shown).

Figure 7:
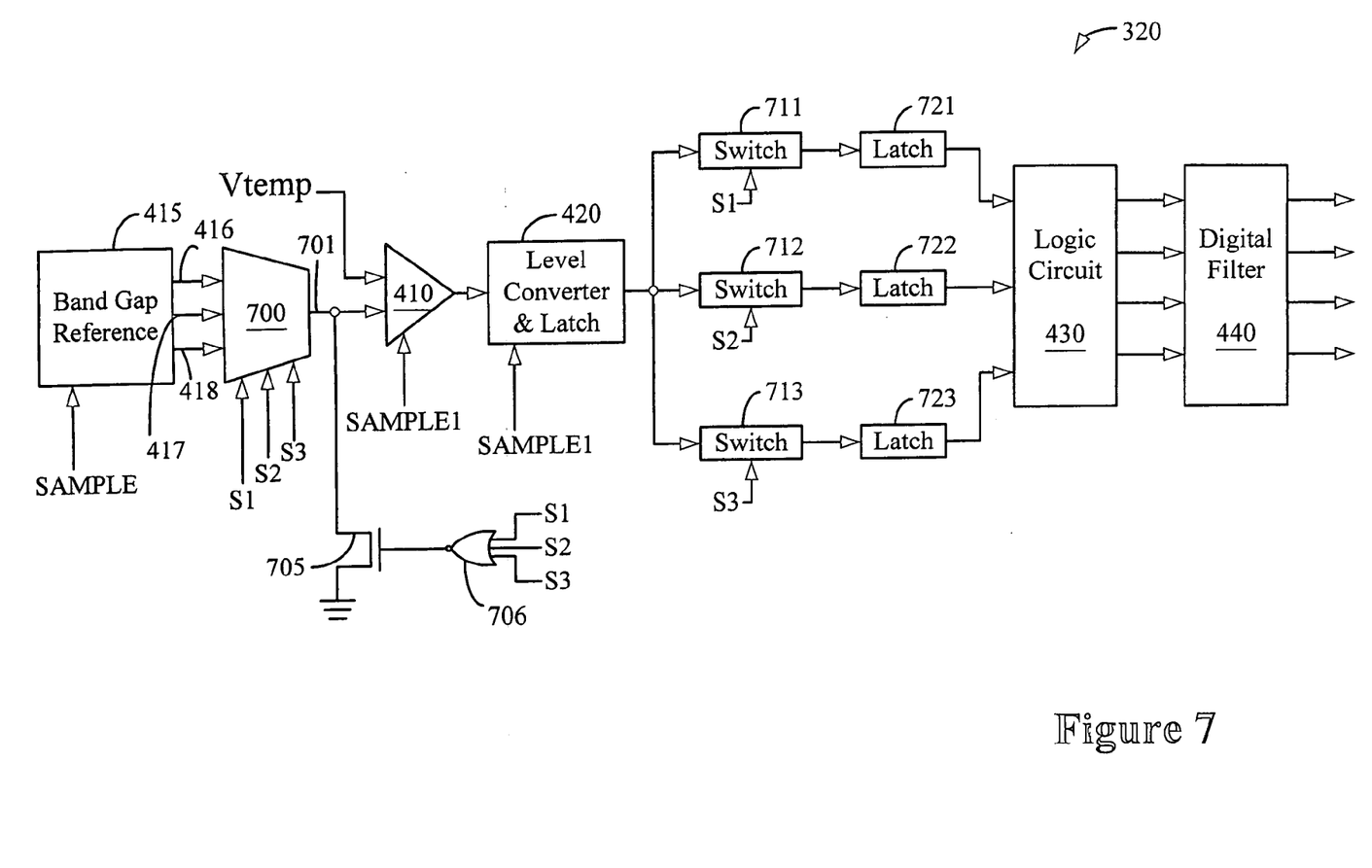
FIG. 7 illustrates a block diagram depiction of a second embodiment of the temperature sensor of FIG. 3.

FIG. 7 illustrates a block diagram of an alternative embodiment of the temperature sensor 320. The embodiment of the temperature sensor 320 illustrated in FIG. 7 is similar in certain aspects to the embodiment of the temperature sensor 320 illustrated in FIG. 4. Thus, where like components are present, like reference numerals are employed. As discussed above, the band gap reference 415 produces three relatively temperature-independent voltages V1, V2, V3 on the lines 415, 416, 417, respectively. In this embodiment, however, the lines 415, 416, 417 are coupled to a multiplexer 700, which controllably delivers the reference voltage on each of the lines 415, 416, 417 to its output terminal 701. Control and timing of the multiplexer 700 is accomplished by timing signals S1, S2, S3, discussed in more detail below in conjunction with FIG. 8.

The output terminal 701 of the mulitplexer 700 is coupled to a single comparator, such as the comparator 410. In this embodiment, unlike the embodiment of FIG. 4, the single comparator 410 in combination with the multiplexer 700 replaces the three-comparator 410, 411, 412 arrangement of FIG. 4. The single comparator embodiment of the temperature sensor 320 has advantages, such as reduced power consumption, less susceptibility to process variations, and a smaller, more compact design, which advantageously preserves semiconductor real estate.

The output terminal 701 of the multiplexer 700 is also coupled to electrical ground through a transistor 705. The transistor 705 is controllably biased by a logic device, such as a NOR gate 706. The input terminals of the NOR gate 706 are coupled to timing signals S1, S2, S3. The operation of the NOR gate 706 and the transistor 705 is discussed in greater detail below in conjunction with FIG. 8.

The output terminal of the comparator 410 is coupled to a signal level converter and latch, such as the level converter and latch 420. As in the embodiment of FIG. 4, the function of the level converter and latch 420 is to convert the asserted and unasserted output signals provided by the comparator 410 to voltage levels compatible with and corresponding to CMOS circuitry, and to store the CMOS type signals for subsequent processing.

To further accommodate the multiplexed nature of the instant embodiment, a set of three switches 711, 712, 713 and three latches 721, 722, 723 are coupled to the output terminal of the level converter and latch 420 in a parallel arrangement. Operation of the switches 711, 712, 713 is controlled by the timing signals S1, S2, S3 as discussed more fully below in conjunction with FIG. 8. A logic circuit 430 and digital filter 440 are coupled in substantially the same manner as described above with respect to the embodiment of FIG. 4.

Figure 8:
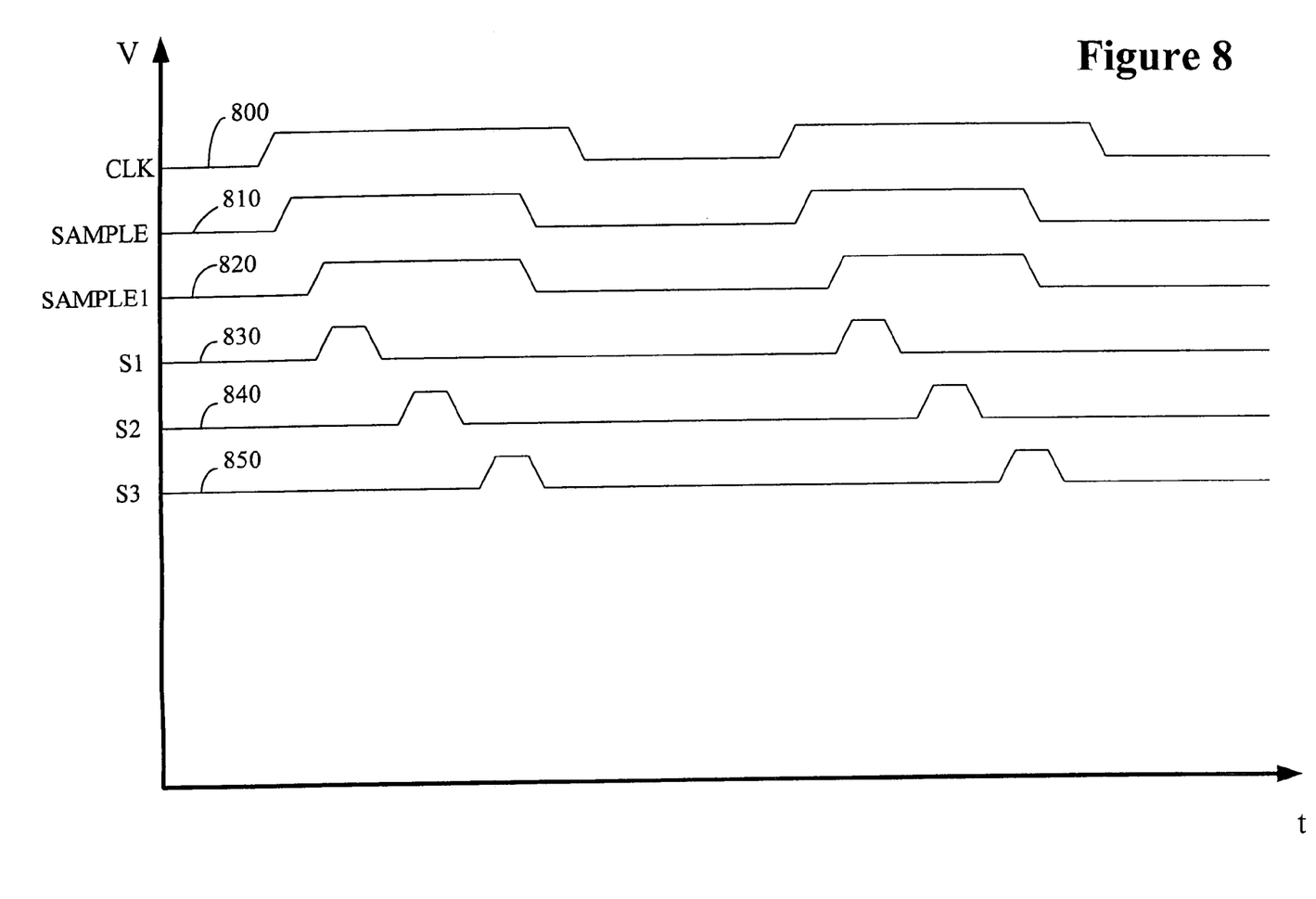
FIG. 8 illustrates a timing diagram associated with temperature sensor of FIG. 3.

Operation of the embodiment of the temperature sensor 320 of FIG. 7 may be appreciated by simultaneous reference to the schematic of FIG. 7 along with the timing diagrams of FIG. 8. A clock signal 800 is used as a basic reference for the generation of each of the other timing signals discussed herein. For example, a SAMPLE signal 810 transitions to an asserted state in response to a transition in the clock signal. The function of the SAMPLE signal 810 is to enable the band gap reference 415 to produce the reference voltages V1, V2, V3 on the lines 416, 417, 418. In the illustrated embodiment, the use of the SAMPLE signal 810 to enable the band gap reference 415 periodically and for a short duration of time helps to reduce the amount of power consumed by the temperature sensor 320.

Similarly, a SAMPLE1 signal 820 enables the comparator 410 and the level converter and latch 420. During the time that the SAMPLE 1 signal is asserted, S1, S2 and S3 timing signals 830, 840, 850 are serially asserted to cause the multiplexer 700 to serially deliver the band gap reference voltages V1, V2, V3 to one input of the comparator 410. Thus, during the period of time that the S1 signal 830 is asserted, the comparator 410 receives the temperature dependent voltage $V_{temp}$ and the first reference voltage V1 and provides a signal indicating whether $V_{temp}$ or V1 is greater. The result of that comparison is, during the time that the timing signal S1 is asserted, converted to a CMOS level and latched by the level converter and latch 420. The timing signal S1 is also delivered to and enables the switch 711. Thus, the signal stored in the level converter and latch 420 is passed through the switch 711 and stored in the latch 721.

Similarly, during the period of time that the S2 signal 840 is asserted, the comparator 410 receives the temperature dependent voltage $V_{temp}$ and the second reference voltage V2 and provides a signal indicating whether $V_{temp}$ or V2 is greater. The result of that comparison is, during the time that the S2 signal 840 is asserted, converted to a CMOS level and latched by the level converter and latch 420. The S2 signal 840 is also delivered to and enables the switch 712. Thus, the signal stored in the level converter and latch 420 is passed through the switch 712 and stored in the latch 722.

Likewise, during the period of time that the timing signal S3 is asserted, the comparator 410 receives the temperature dependent voltage $V_{temp}$ and the third reference voltage V3 and provides a signal indicating whether $V_{temp}$ or V3 is greater. The result of that comparison is, during the time that the S3 signal 850 is asserted, converted to a CMOS level and latched by the level converter and latch 420. The S3 signal 850 is also delivered to and enables the switch 713. Thus, the signal stored in the level converter and latch 420 is passed through the switch 713 and stored in the latch 723.

The S1, S2, S3 signals 830, 840, 850 are also coupled to the input terminals of the NOR gate 706. Thus, during the periods of time when none of the S1, S2, S3 signals are asserted, the NOR gate 706 biases the transistor 705 "on," pulling the output terminal 701 to approximately ground. This action reduces the likelihood that the comparator 410 will produce a false signal during the period of time between the signals S1, S2, S3 by forcing the comparator 410 to a known state between each sampling period.

At the completion of the S3 signal 850, the logic circuit 430 has the results of the comparisons between the temperature dependent voltage $V_{temp}$ and the three band gap reference voltages V1, V2, V3 presented at its three input terminals. Thereafter, the operation of the logic circuit 430 and digital filter 440 operate in substantially the same manner as discussed above in conjunction with the embodiment of the temperature sensor 320 illustrated in FIG. 4.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A memory device, comprising:
    a volatile memory array; and
    a memory controller coupled to said volatile memory array to generate a signal responsive to temperature and adjust a refresh rate associated with at least a portion of said volatile memory array in response to said signal being substantially the same for at least two consecutive sample periods.

2. The memory device, as set forth in claim 1, wherein the memory controller comprises:
    a refresh rate control unit adapted to increase the refresh rate in response to detecting an increase in the temperature based on the signal responsive to temperature.

3. The memory device, as set forth in claim 2, wherein said refresh rate control unit further comprises:
    a temperature sensor to provide a temperature signal;
    a comparator coupled to receive the temperature signal at a first input terminal and a reference signal at a second input terminal, said comparator being adapted to deliver a first signal as the signal responsive to temperature in response to the temperature signal being less than the reference signal and a second signal as the signal responsive to temperature in response to the temperature signal rising above the reference signal; and
    an oscillator adapted to produce a refresh signal at a first preselected rate in response to receiving the first signal and at a second preselected rate in response to receiving the second signal.

4. The memory device, as set forth in claim 3, wherein the oscillator includes a counter and a logic circuit adapted to select a first bit of the counter to produce the refresh signal in response to receiving the first signal and select a second bit of the counter to produce the refresh signal in response to receiving the second signal.

5. The memory device, as set forth in claim 3, wherein the comparator is further adapted to deliver the first signal in response to the temperature signal falling a preselected magnitude below the reference signal and the comparator includes a hysteresis effect.

6. The memory device, as set forth in claim 3, wherein the memory device is at least one of a static random access memory (SRAM), a dynamic random access memory (DRAM), a double-data rate SDRAM (DDR SDRAM), a Rambus DRAM (RDRAM), and a FLASH memory.

7. The memory device of claim 3, further comprising:
    a digital filter coupled electrically intermediate the comparator and the oscillator, wherein the digital filter is operable to provide the second signal to the oscillator responsive to the second signal persisting for the at least two sample periods.

8. The memory device, as set forth in claim 3, wherein the temperature sensor is thermally coupled with the volatile memory array.

9. The memory device, as set forth in claim 1, wherein the dynamic memory device is at least one of a static random access memory (SRAM), a dynamic random access memory (DRAM), a double-data rate SDRAM (DDR SDRAM), a Rambus DRAM (RDRAM), and a FLASH memory.

10. The memory device, as set forth in claim 3, wherein the temperature sensor is at least partially formed within a common substrate with the dynamic memory device.

11. The memory device, as set forth in claim 2, wherein the refresh rate control unit is further adapted to provide a first signal in response to the temperature signal being within a first preselected range and a second signal in response to the temperature signal being within a second preselected range, said refresh rate control unit being further adapted to provide a refresh signal at a first preselected rate in response to receiving the first signal and at a second rate in response to receiving the second signal.

12. A system including a device for use with a dynamic random access memory device, the system comprising:
    means for detecting a temperature of at least a portion of said dynamic random access memory device to provide a signal indicative of the temperature; and
    means for adjusting a refresh rate associated with at least a portion of said dynamic random access memory device in response to the signal indicative of the detected temperature being substantially the same for at least two sample periods.

13. A method for controlling refreshing of a memory array device, the method comprising:
    providing a signal indicative of a temperature detected in at least one memory cell portion of said memory array device
    adjusting a refresh rate associated with the at least one portion of said memory array device in response to said signal being substantially the same for at least two sample periods.

14. The method, as set forth in claim 13, further comprising:
    increasing the refresh rate associated with the at least one memory cell portion of said memory array device in response to an increase in the magnitude of the detected temperature.

15. The method, as set forth in claim 13, further comprising:
  comparing the signal with a reference signal and delivering a refresh signal at a first preselected rate in response to the signal being less than the reference signal and at a second preselected rate in response to the signal rising above the reference signal.

16. The method, as set forth in claim 15, further comprising:
  delivering the refresh signal at the first preselected rate in response to the signal falling a preselected magnitude below the reference signal.

17. The method, as set forth in claim 15, further comprising:
  using a hysteresis effect to the compare the signal with the reference signal.

18. A system comprising:
  a processor;
  memory; and
  a memory controller operatively coupling the processor with the memory and being adapted to control refresh operations of the memory, the memory controller comprising:
    a sensor adapted to provide a signal responsive to temperature of at least a portion of the memory; and
    a refresh rate control unit operatively coupled with said sensor, said refresh rate control unit being adapted to adjust a refresh rate associated with at least a portion of the memory in response to said signal responsive to temperature being substantially the same for at least two sample periods.

19. The memory device, as set forth in claim 1, wherein said memory controller is operable to determine said signal is substantially the same by determining said signal is within a defined temperature range for the at least two sample periods.

20. The method, as set forth in claim 13, further comprising:
  determining said signal is substantially the same by determining said signal is within a defined temperature range for the at least two sample periods.

21. The memory device, as set forth in claim 2, wherein said refresh rate control unit further comprises:
  a temperature sensor to provide a temperature signal;
  a multiplexer operable to select one of a plurality of reference signals;
  a comparator coupled to receive the temperature responsive signal at a first input terminal and the selected reference signal at a second input terminal, said comparator being adapted to deliver the signal responsive to temperature at a first state in response to the temperature signal being less than the reference signal and a second state as in response to the temperature signal rising above the reference signal;
  logic operable to control the multiplexer to cycle through the plurality of reference signals and store the state of the signal responsive to temperature for each cycle; and
  an oscillator adapted to produce a refresh signal at a rate dependent on the state of the signal responsive to temperature for each cycle.

22. A memory device, comprising:
  a volatile memory array; and
  a memory controller coupled to said volatile memory array and including a refresh control unit operable to receive a signal responsive to temperature and adjust a refresh rate associated with at least a portion of said volatile memory array based on said signal, wherein the refresh control unit comprises:
    a temperature sensor to provide the temperature responsive signal;
    a comparator coupled to receive the temperature responsive signal at a first input terminal and a reference signal at a second input terminal, said comparator being adapted to deliver a first signal in response to the temperature responsive signal being less than the reference signal and a second signal in response to the temperature responsive signal rising above the reference signal; and
    an oscillator adapted to produce a refresh signal at a first preselected rate in response to receiving the first signal and at a second preselected rate in response to receiving the second signal, wherein the oscillator includes a counter and a logic circuit adapted to select a first bit of the counter to produce the refresh signal in response to receiving the first signal and select a second bit of the counter to produce the refresh signal in response to receiving the second signal.

* * * * *